United States Patent [19]

Nanba et al.

[11] Patent Number: 5,221,589
[45] Date of Patent: Jun. 22, 1993

[54] PHOTOSENSITIVE RESIN COMPOSITION

[75] Inventors: Osamu Nanba, Takarazuka; Chitoshi Kawaguchi, Soraku; Seiji Arimatsu, Hirakata; Kazunori Kanda, Yao, all of Japan

[73] Assignee: Nippon Paint Co., Ltd., Osaka, Japan

[21] Appl. No.: 678,934

[22] Filed: Apr. 3, 1991

[30] Foreign Application Priority Data

Apr. 6, 1990 [JP] Japan .................................. 2-92704

[51] Int. Cl.$^5$ ............................................. G03F 7/033
[52] U.S. Cl. ................................... 430/283; 522/116; 522/117; 430/909
[58] Field of Search ................ 526/306, 302; 430/283, 430/909; 522/116, 117

[56] References Cited

U.S. PATENT DOCUMENTS

| | | | |
|---|---|---|---|
| 3,551,148 | 12/1970 | Faulhaber | 430/283 |
| 4,209,581 | 6/1980 | Takanashi et al. | 430/283 |
| 4,507,382 | 3/1985 | Rousseau et al. | 430/283 X |
| 4,604,343 | 8/1986 | Sakurai et al. | 430/283 X |

FOREIGN PATENT DOCUMENTS

| | | | |
|---|---|---|---|
| 49-33179 | 9/1974 | Japan | 526/306 |
| 0947610 | 1/1964 | United Kingdom | 526/304 |

*Primary Examiner*—Cynthia Hamilton
*Attorney, Agent, or Firm*—Wenderoth, Lind & Ponack

[57] ABSTRACT

Disclosed is a photosensitive resin composition which, can be hot melt molding and and is water-developable. The composition does not need the preliminary exposure process and when cured has suitable hardness and printing properties. The photosensitive resin composition comprises;

(A) a water soluble or water dispersible polyvinyl alcohol prepared by saponifying a copolymer obtained by copolymerizing 90 to 99.9 mol % of a vinyl ester and 0.1 to 10 mol % of an ionic group-containing monomer; said polyvinyl alcohol having a saponification degree of the vinyl ester unit of 60 to 75 mol % and a hot melt flow starting temperature of 95° to 170° C., (B) a polymerizable compound prepared by reacting in the presence of an acid catalyst, (i) N-methylol (meth-)acrylamide or N-alkoxymethyl (meth)acrylamide and (ii) a compound selected from the group consisting of monoalcohols, polyhydric alcohols, amides, haloalkylamides, aromatic compounds, ureas and mixtures thereof, and (C) a photopolymerization initiator.

The present invention also provides a photosensitive resin plate obtained from the above resin composition, and further provides a particular polymerizable compound which is very suitable for the photosensitive resin composition.

13 Claims, No Drawings

PHOTOSENSITIVE RESIN COMPOSITION

FIELD OF THE INVENTION

The present invention relates to a water-developable photosensitive resin composition which is capable of hot melt molding.

BACKGROUND OF THE INVENTION

Photosensitive resin compositions for printing plates, resists and the like, which are developable with water, are known in the art.

The resin compositions are generally prepared by dissolving a polyvinyl alcohol in water and then admixing a monomer and a photopolymerization initiator. The compositions are applied on a suitable substrate and then water is evaporated to obtain a photosensitive resin plate for printing. The photosensitive resin compositions employ water as a solvent which must be removed from the composition. The removal of water requires a large scale apparatus and takes time.

The photosensitive resin compositions contain oxygen, called "dissolved oxygen", in a small amount, but the oxygen has a function of polymerization inhibition which often provides poor reproducibility of thin lines. In order to obviate the problem, the compositions are preliminarily exposed to light to consume the dissolved oxygen, before the main exposure. The preliminary exposure to the light, however, makes the process complicated. A photosensitive resin composition which does not need such preliminary exposure is therefore desired.

Also, the cured resin composition is required to have suitable hardness. If the cured composition is too hard, it is fragile and often broken or cracked. If it is not hard, the composition has poor printing properties. The hardness can be controlled by lowering the saponification degree of the polyvinyl alcohol, but the low saponification degree adversely affects water solubility and reduces the water developability.

SUMMARY OF THE INVENTION

The present invention provides a photosensitive resin composition which is capable of hot melt molding and is water-developable. The composition does not need the preliminary exposure process and, when cured, has suitable hardness and printing properties. The photosensitive resin composition of the present invention comprises;

(A) a water soluble or water dispersible polyvinyl alcohol prepared by saponifying a copolymer obtained by copolymerizing 90 to 99.9 mol % of a vinyl ester and 0.1 to 10 mol % of an ionic group-containing monomer; said polyvinyl alcohol having a saponification degree of the vinyl ester unit of 60 to 75 mol % and a hot melt flow starting temperature of 95° to 170 ° C., (B) a polymerizable compound prepared by reacting in the presence of an acid catalyst,
  (i) N-methylol (meth)acrylamide or N-alkoxymethyl (meth)acrylamide and
  (ii) a compound selected from the group consisting of monoalcohols, polyhydric alcohols, amides, haloalkylamides, aromatic compounds, ureas and mixtures thereof, and (C) a photopolymerization initiator.

The present invention also provides a photosensitive resin plate and a printing plate obtained from the above resin composition.

The present invention further provides a particular polymerizable compound which is very suitable for the photosensitive resin composition.

DETAILED DESCRIPTION OF THE INVENTION

The polyvinyl alcohol (A) employed in the present invention is prepared by saponifying a copolymer which is obtained by copolymerizing a vinyl ester and an ionic group-containing monomer (hereinafter referred to as "ionic monomer"). Examples of the vinyl esters are vinyl formate, vinyl acetate, vinyl propionate, vinyl benzoate and the like. Vinyl acetate is preferred. The ionic monomer is a compound which has an ethylenically unsaturated group copolymerizable with the vinyl ester and an ionic group. Examples of the ionic groups are a carboxyl group or a salt thereof, a sulfonic acid group or a salt thereof, a phosphoric acid group or a salt thereof, an amino group, an ammonium group and the like. Examples of the ionic monomers are (meth)acrylic acid, itaconic acid, maleic acid, maleic anhydride, fumaric acid, 2-acrylamide propanesulfonic acid, (meth)allylsulfonic acid, and a salt thereof if existent, and (meth)acrylamidepropyltrimethylammonium chloride. The term "(meth)acryl" herein means both acryl and methacryl and the term "(meth)allyl" also means both allyl and methallyl. Preferred are (meth)acrylic acid, itaconic acid, maleic anhydride, 2-acrylamide-propane-sulfonic acid and (meth)allylsulfonic acid. The ionic monomer imparts water solubility to the polyvinyl alcohol (A) and also good compatibility between the polyvinyl alcohol (A) and the polymerizable compound (B).

The ionic monomer is employed in an amount of 0.1 to 10 mol %, preferably 0.2 to 7 mol %, based on the total amount of the monomer components of the polyvinyl alcohol. If the amount is less than 0.1 mol %, the obtained resin composition has poor water developability. If it is more than 10 mol %, the resin composition has poor dimensional stability.

The polyvinyl alcohol of the present invention should have the following properties; (a) the obtained photosensitive resin composition has a suitable melt viscosity; (b) the polyvinyl alcohol is compatible with the polymerizable monomer (B); (c) the polyvinyl alcohol is water-soluble or water-dispersible; [by the term "water-soluble or water-dispersible" is meant that a vinyl alcohol polymer is completely dissolved or dispersed when it is dissolved in water to a concentration of 1% by weight at 25° C.]; and (d) the obtained photosensitive resin composition has good dimensional stability, that is, it has good creep resistance against heat for shape retention. In order to meet the required properties, it is necessary that the polyvinyl alcohol of the present invention has a saponification degree of the vinyl ester unit of 60 to 75 mol % and a hot melt flow starting temperature of 95° to 170° C. It is, also, desired that the polyvinyl alcohol has an average polymerization degree of not more than 1,000, preferably not more than 700, more preferably within the range of 100 to 500. The saponification degree of the vinyl ester, although it varies depending on the content of the ionic monomer, is within the range of 60 to 75 mol % because of the compatibility with the polymerizable monomer (B) and/or the initiator (C). The saponification degrees of more than 75 mol % become unsuitable due to an elevated hot melt flow starting temperature. Those of less than 60 mol % become difficult to use because the dimensional stability of the resin plate. If the average polymerization degree is more than 1,000, a melt viscosity is too high. By "hot melt flow starting temperature" herein is meant a temperature at which a polyvinyl alcohol having a water content of 3 weight % starts to flow when heated at 6° C./min under a load of 50 Kg in a flow tester equipped with a nozzle having a diameter of 1 mm and a length of 1 mm. The average polymerization degree ($\bar{P}$) is calculated according to the viscosity formula using an intrinsic viscosity ($\eta$) measured at 30° C. in water, represented $$P = \left[ \frac{(\eta) \times 10^3}{8.29} \right]^{\frac{1}{0.62}}$$

wherein ($\eta$) has dl/g dimension.

The polymerizable compound (B) is prepared by reaching in the presence of an acid catalyst, (i) N-methylol (meth)acrylamide or N-alkoxymethyl (meth)acrylamide (e.g. N-ethoxymethyl (meth)acrylamide) and (ii) a compound selected from the group consisting of monoalcohols, polyhydric alcohols, amides, haloalkylamides, aromatic compounds, ureas and mixtures thereof. Examples of the compounds (ii) are monoalcohols, such as methanol, ethanol, propanol, stearyl alcohol etc.; and polyhydric alcohols, such as (poly)ethylene glycol, (poly)propylene glycol, propane diol, butane diol, neopenthyl glycol, glycerol, pentaerythritol, trimethylolpropane, polyvinyl alcohol etc.; amides, such as acrylamide, the above listed (meth)acrylamide derivative (i) [in this case, a self-condensation reaction of the (meth)acrylamide derivative is included.], a haloalkylamide, a sulfoneamide etc.; aromatic compounds, such as hydroquinone, phenothiazine, phenol, benzoic acid etc.; ureas, such as urea etc.; and the like. The polymerizable compound (B) is generally represented by the following formula;

CRH=CH—CO—NH—CH$_2$—N-H—CO—CH=CRH, wherein R respectively represents a hydrogen atom or a methyl group, or (CRH=CH—CO—NH—CH$_2$—)$_n$—Q wherein R is the same as mentioned above, Q represents an oxygen atom, a monoalcohol moiety, a polyhydric alcohol moiety, an amide moiety, an aromatic compound moiety and a urea moiety and n shows an integer of 1 to 50, preferably 1 to 20, more preferably 2 or 3.

Preferred polymerizable compound (B) is a reaction product of the polyhydric alcohols and N-alkoxymethyl (meth)acrylamide. The polyhydric alcohols preferably are a polyethylene glycol [HO—(CH$_2$CH$_2$O)m—H] and polypropylene glycol [HO—CH(CH$_3$)CH$_2$O)-m—H] wherein m is an integer of 1 to 14, preferably 1 to 5. The reaction is carried out in the presence of an acid catalyst. Examples of the acid catalysts are inorganic acids, such as sulfuric acid, hydrochloric acid, phosphoric acid, ammonium chloride and the like; organic acids, such as formic acid, acetic acid, succinic acid, phthalic acid, fumaric acid, maleic acid, benzoic acid, benzensulfonic acid, toluenesulfonic acid, an alkylbenzenesulfonic acid and the like. The acid catalyst may be acid ion-exchange resins. The ion-exchange resins may be easily removed from the reaction system by filtering after finishing the reaction. The acid catalyst preferably has a polymerizable group, including (meth)acrylic acid, crotonic acid, maleic acid, maleic anhydride, fumaric acid, (meth)acrylsulfonic acid, vinylsulfonic acid, styrene-p-sulfonic acid, 2-acrylamide-2-methylpropanesulfonic acid, acrylamidemethanesulfonic acid, 2-amidephosphoxyethyl acrylate, allylsulfonic acid, methallysulfonic acid and the like. The acid catalyst is generally neutralized with a base after finishing the reaction. Examples of the bases are inorganic bases, such as sodium hydroxide, potassium hydroxide and calcium hydroxide; and amines, such as propylamine, triethylamine, dipropylamine, butylamine, dibutylamine, tributylamine, 3-aminopropanol, 1,2-bis-(3-aminopropoxy)ethane, 1,4-diaminobutane, N-aminoethylpiperidine, piperidine and a piperidine derivative. It is also preferred that the base contains a polymerizable groups, thus including dimethylaminomethyl (meth)acrylate, dimethylaminopropyl (meth)acrylate, diethylaminoethyl (meth)acrylate, dimethylaminomethyl (meth)acrylate, diethylaminoethyl (meth)acrylate, diethylaminopropyl (meth)acrylate and the like. It is preferred that both the acid catalyst and the base contain polymerizable groups. In case where the acid catalyst or the base contains the polymerizable group, the composition when cured has excellent water resistance and improved water developability. The reaction may be carried out at a temperature of 30 to 120° C. for one to 50 hours with stirring in the presence of a polymerization inhibitor (such as hydroquinone, methoxyphenol and methylhydroquinone). The polymerizable compound (B), when formulated into the photopolymerizable composition, reduces a curing period of time and can easily adjust softness and hardness. 2-Hydroxyethyl methacrylate etc., which is used for the photopolymerizable compound in the photosensitive resin composition, does not cure the surface of the composition because of the presence of oxygen, but only cures therein-side, thus the cured article being hard and fragile. On the other hand, since the polymerizable compound (B) cures very quickly when exposed to light, the bad effects due to oxygen can be ignored and the surface of the resin composition which contacts with oxygen cures sufficiently to provide tough and excellent cured articles. The polymerizable compound (B) can be advantageously used for other applications, such as designation of curable resins and therefore is not limited in its application.

The polymerization initiator (C) is not specifically limited, but an aromatic ketone is generally employed. The aromatic ketone is a compound which has an aromatic ring and a carbonyl group in one molecule, and includes benzoin, benzoin methyl ether, benzoin ethyl ether, benzoin isopropyl ether, alpha-methylbonzoin, 1-methylanthraquinone, 9-fluorenone, benzyl, benzyl dimethyl ketal, acetophenone, bezophenone, phenyl-2-thienylketone, p-dimethylaminobenzophenone, p,p'-tetramethyldiaminobezophenone and the like. The aromatic ketone may contain a substituent, e.g. cyano, nitro, methoxy, sulfonic acid, phosphine acid, a salt or an ester thereof. Representative examples of such substituted aromatic ketones are 2,6-dimethoxybenzoyl-diphenylphosphine oxide, 2,4,6-trimethylbenzoyl-diphenylphosphine oxide, an ester of 2,4,6-trimethyl-benzoyl-phenylphosphinic acid, a sodium salt of 2,4,6-trimethylbenzoyl-phenylphosphinic acid and the like.

The photosensitive resin composition may contain other polymerizable monomers (D) in addition to the polymerizable compound (B), if necessary. The polymerizable monomer (D) is a compound which has at least one polymerizable double bond per one molecule. Examples of the monomers (D) are methyl acrylate, ethyl acrylate, n-propyl acrylate( beta-hydroxyethyl acrylate, beta-hydroxypropyl acrylate, polyethylene glycol monoacrylate, polypropylene glycol monoacrylate, polyethylene glycol diacrylate, polypropylene glycol diacrylate, methoxypolyethylene glycol monoacrylate, ethoxypolyethylene glycol monoacrylate, glycerol diacrylate, pentaerythritol diacrylate, trimethylolpropane triacrylate, tetramethylolmethane tetraacrylate, methyl methacrylate, ethyl methacrylate, n-propyl methacrylate, beta-hydroxyethyl methacrylate, betahydroxypropyl methacrylate, polyethylene glycol monomethacrylate, polypropylene glycol monomethacrylate, polyethylene glycol dimethacrylate, polypropylene glycol dimethacrylate, methoxypolyethylene glycol monomethacrylate, ethoxypolyethylene glycol monomethacrylate, glycerol dimethacrylate, pentaerythritol dimethacrylate, trimethylolpropane trimethacrylate, tetramethylolmethane tetramethacrylate, acrylamide, N-(methylol)acrylamide, N-(butoxymethyl)acrylamide, (isobutoxy)acrylamide, N-(t-butyl)acrylamide, methylene-bis(acrylamide), ethylene-bis(acrylamide), propylene-bis(acrylamide), methacrylamide, N-(methylol)methacrylamide, N-(butoxymethyl)methacrylamide, N-(isobutoxymethyl)methacrylamide, N-(t-butyl)methacrylamide, methylene-bis(methacrylamide), ethylene-bis(methacrylamide), propylene-bis(methacrylamide), butylcarbamoyloxyethyl (meth)acrylate and mixtures thereof. The polymerizable monomer (D) is selected from the point of view of compatibility with polymer employed. In order to improve the compatibility, a suitable solvent, for example, water, an alcohol having a high boiling point, e.g. ethylene glycol, diethylene glycol, propylene glycol, triethylene glycol, butanediol, trimethylolpropane, tetramethylolpropane, glycerol and diglycerol may be formulated.

The polymerizable compound (B) may be present in an amount of 5 to 250 parts by weight, preferably 10 to 200 parts by weight based on 100 parts by weight of the polyvinyl alcohol. If the compound (B) is less than 5 parts by weight, toughness of the cured resin is poor and provides poor images. If it is more than 200 parts by weight, water developability, storage stability and reproducibility are deteriorated. The polymerization initiator (C) may be present in an amount of 0.01 to 30 parts by weight, preferably 0.02 to 25 parts by weight based on 100 parts by weight of the polyvinyl alcohol. Amounts of less than 0.01 does not photocure and those of more than 30 parts by weight reduce the toughness of the cured resin and provide the ununiformity of physical properties. The polymerizable monomer (D) may be present in an amount of 0.5 to 100 parts by weight, preferably 0.5 to 50 parts by weight based on 100 parts by weight of the polyvinyl alcohol. If the monomer (D) is more than 100 parts by weight, water developability, storage stability and reproducibility are deteriorated.

The water-developable photosensitive resin composition of the present invention may further contain additives. the additives include polymerization inhibitors, e.g. 2,6-di-t-butyl-p-cresol, hydroquinone and p-methoxyphenol; dyes, e.g. Rose Bengale, eosine, methylene blue or malachite green; and the like.

Since the photosensitive resin composition of the present invention employs a particular polyvinyl alcohol (A), it is capable of hot melt molding. Hot melt molding is generally conducted by an extruder, a kneader, a hot press machine and the like. According to the present invention, the process for making a photosensitive resin plate can be shortened and can reduce its cost, since a large scale drying step is not required. In the hot melt molding process, water may be added for plasticizing the resin composition, but the amount of water to be added is very small in comparison with a conventional method mentioned above. A water content in the resin composition is preferably not more than 10 parts by weight, more preferably within the range of 3 to 8 parts by weight based on the amount of the photosensitive resin composition of the present invention.

According to the present invention, the photosensitive resin composition is molded onto a suitable substrate to obtain a photosensitive resin plate. Examples of the substrates are metal, such as aluminum, zinc and iron; plastics, such as polyethylene terephthalate, polystyrene, polymethylmethacrylate, nylon, cellulose acetate, polyethylene, polypropylene, polycarbonate, polyacrylonitrile and polyvinylchloride; glass; a natural or synthetic rubber, a rubber foam and any combination or laminate thereof; and the like. The substrate may be preliminarily surface-treated by etching, electrolytic oxidation, corona discharge and the like. Also, the substrate may be covered with an adhesive layer, an antihalation layer and the like.

A preparation of the relief printing plate is known. For example, the photosensitive resin plate as above obtained is closely contacted with an image film, such as a negative film or a positive film, through a suitable cover layer and exposed to light. Development by washing the photosensitive resin composition at the unexposed areas with a developer, especially water give a visible image. Exposure is conducted with actinic light sources, such as medium pressure mercury vapor lamps, high pressure mercury vapor lamps, ultra high pressure mercury vapor lamps, xenon lamps, metal halide lamps, ultraviolet, fluorescent lamps and the like. The light sources can also be tungsten lamps, white fluorescent lamps, visible light laser and the like.

The photosensitive resin composition of the present invention is water-developable and therefore is employed as various image-forming materials, such as a photoresist and the like.

The polymerizable compound (B) employed in the present invention may be combined with a binder resin other than the polyvinyl alcohol (A), such as an acryl resin, a polyester resin, an alkyd resin, an epoxy resin, a polyvinyl resin, a fluorine resin, a silicone resin, a polyphenol resin, an amino resin, a polybutadiene resin, a polyurethane resin and a modified resin thereof to form another type curing resin composition, expecially an active energy light curing resin composition. The polymerizable compound (B) may be copolymerized with other monomers to obtain an oligomer or a polymer.

EXAMPLES

The present invention is illustrated by the following examples, which are not construed as limiting the invention to their details. In the Examples, "part(s)" is based on weight unless otherwise indicated.

PREPARATION EXAMPLE 1

A reaction vessel equipped with a reflux condenser, a stirrer, a thermometer, a nitrogen gas introducing tube and a dropping funnel was charged with 500 g of vinyl acetate, 1,950 g of methanol and 0.22 g of itaconic acid and heated to 60° C. with stirring in a nitrogen atmosphere. At 60° C., 2.3 g of 2,2'-azobisisobutylonitrile and 50 g of methanol were added thereto to start polymerizing. To the content, 51.9 g of a 10 % methanol solution of itaconic acid was added over 5 hours so as to make constant a ratio of itaconic acid and vinyl acetate. After 5 hours from starting polymerization, 1,200 g of methanol was added to terminate the polymerization. The solid content of the polymerization solution just before the termination was 13.9 % by weight and a polymerization degree of vinyl acetate was 70%. Unreacted vinyl acetate was azeotropically diluted with methanol to obtain a 40% methanol solution of a copolymer of vinyl acetate and itaconic acid. Then, 500 g of the copolymer solution was heated to 40° C. and saponified with a solution of 2.2 g of sodium hydroxide and 165 g of methanol. The resulting gelled polymer was ground and rinsed with a mixture of methyl acetate/methanol of 6/4 (weight ratio), followed by drying to obtain a polyvinyl alcohol. The polyvinyl alcohol was analyzed with NMR to find that the content of itaconic acid unit was 1.0 mol % and a saponification degree of the vinyl acetate unit was 73.2 mol %. The polymerization degree was 330, which was determined by measuring intrinsic viscosity at 30° C. in water. The polyvinyl alcohol (A) (water content: 3 % by weight) had a hot melt flow starting temperature of 150° C.

PREPARATION EXAMPLE 2

A same reaction vessel as Preparation Example 1 was charged with 1,800 parts by weight of vinyl acetate, 3,500 parts by weight of methanol and one part by weight of sodium 2-acrylamide-2-methylpropanesulfonate and heated to 60° C. in a nitrogen gas atmosphere. Polymerization was started by adding a mixture of 24 parts by weight of 2,2'-azobisisobutylonitrile and 150 parts by weight of methanol. Then, 35 parts by weight of a methanol solution of 11 parts by weight of sodium 2-acrylamide-2-methylpropanesulfonate was added thereto and the solid content just before the termination of the polymerization was 23.3 %. Unreacted vinyl acetate was azeotropically removed with methanol to obtain a 65 % methanol solution of the copolymer. The copolymer was subjected to an NMR analysis to find that the content of sodium 2-acrylamide-2-methylpropanesulfonate unit was 0.35 mol %.

Saponification was conducted at 40° C. for 30 minutes by adding 11 parts by weight of a methanol solution of 2N sodium hydroxide to 100 parts by weight of the methanol solution of the copolymer. The resulting white gel was ground and rinsed with a mixture of methyl acetate/methanol of 8/2 (weight ratio), followed by drying.

The resulting polyvinyl alcohol (B) was analyzed as generally described in Preparation Example 1 to show a saponification degree of the vinyl ester unit of 61 mol %, a polymerization degree of 350 and a hot melt flow starting temperature of 101° C.

PREPARATION EXAMPLE 3

Preparation of the Polymerizable Compound (B)

A reaction vessel was charged with 230 g (2 mol) of N-methoxymethylacrylamide, 62 g (1 mol) of ethylene glycol, 10 g of Amberlist (strong acid ion-exchanging resins available from Organo Co., Ltd.) and 0.1 g of p-methoxyphenol and reacted at 50° C. with stirring for six hours. After termination of the reaction, the ion-exchanging resins were filtered and allowed to stand over night, followed by filtering to obtain a liquid reaction product.

The resulting product was subjected to a high speed liquid chromatography (Shim-pack CLC-ODS available from Shimadzu Co., Ltd.) and the mixture contained diethers, monoethers, methoxymethylacrylamide, methylenebisacrylamide and acrylamide.

A cylindrical can having a diameter of 6.5 cm was charged with 10 g of the product and 0.3 g of 2-hydroxy-2-methyl-1-phenylpropane-1-on and exposed to a 3 kW high pressure mercury lamp at a distance of 70 cm for 3 seconds. The mixture was cured throughout and a tough and hard cured article was obtained.

PREPARATION EXAMPLES 4 TO 7

A synthesis was conducted as generally described in Preparation Example 3, using the formulations shown in Table 1. The same curing test was subjected to the obtained product and the results are shown in Table 1.

TABLE 1

| | Acrylamide (g:mol) | Polyhydric alcohol (g:mol) | Reaction temp./time (°C./hours) | UV irradiation time to cure (seconds) |
|---|---|---|---|---|
| Pre. Ex. | | | | |
| 3 | N-methoxymethylacrylamide (230 g:2 mol) | Ethylene glycol (62 g:1 mol) | 50/6 | 3 |
| 4 | N-methoxymethylacrylamide (345 g:3 mol) | Triethylene glycol (150 g:1 mol) | 50/6 | 3 |
| 5 | N-methoxymethylacrylamide (345 g:3 mol) | Glycerol (92 g:1 mol) | 50/6 | 3 |
| 6 | N-methoxymethylacrylamide (173 g:1.5 mol) | polyethylene glycol #300 (150 g:0.5 mol) | 50/6 | 2 |
| 7 | N-n-buthoxymethylacrylamide (236 g:1.5 mol) | Ethylene glycol (53 g:0.5 mol) | 50/6 | 3 |

COMPARATIVE PREPARATION EXAMPLE 1

A polyvinyl alcohol having a saponification degree of 55 mol % was prepared as generally described in Preparation Example 1, with the exception that 0.35 mol % of sodium 2-acrylamide-2-methylpropanesulfonate was employed. The obtained polyvinyl alcohol had a polymerization degree of 360 and a melt flow starting temperature of 90° C.

EXAMPLE 1

Forty parts of the polyvinyl alcohol of Preparation Example 1 and 6 parts of water were kneaded at 80 to 85° C. for 30 minutes.

Separately, into 30 parts by weight of the monomer prepared in Preparation Example 3, 0.05 parts of p-methoxyphenol and 0.3 parts of 2,2'-dimethoxy-2-phenylacetophenone were dissolved to form a solution. The solution was added to the kneaded mixture and mixed at 80° C. for 30 minutes. The resultant mixture was fed into a twin screw extruder at 80° C., mixed, defoamed and extruded onto a pretreated steel panel coated with an antihalation layer having a thickness of 0.3 mm to form a composition layer of 1.0 mm in thickness. Then, a cover film was laminated on it to form a photosensitive resin plate.

The photosensitive surface of the resin plate was closely contacted under vacuum to a testing negative film having isolated dots of 170 microns, 200 microns, 250 microns, 320 microns and 660 microns, and exposed to a 65 W chemical lamp at a distance of 5 cm. An irradiation time was 1 minute and 20 seconds. The exposed resin plate was developed by blowing neutral water for one minute and 50 second at 40° C. using a spray developing machine. An unexposed portion, i.e. uncured portion was washed out to water to obtain a relief printing plate. The relief printing plate was dried at 90° C. for 30 minutes and isolated dots having a diameter of 200 microns remained. The cured composition had a Shore D hardness of 85°, but the plate showed no cracks if folded. The relief is tough and hard. After 6 months, no cracks occur if folded.

The results are shown in Table 2.

EXAMPLE 2

A printing plate was prepared as generally described in Example 1, with the exception that the polymerizable compound was changed to a mixture of 20 parts by weight of the monomer of Preparation Example 3 and 10 parts by weight of ethyleneglycol dimethacrylate, and exposed and developed as generally described in Example 1. Isolated dots of 250 microns remained. It had a Shore D hardness of 85° and no cracks occur when folded until 90°. The results are shown in Table 2.

EXAMPLE 3

A printing plate was prepared as generally described in Example 1, with the exception that the polymerizable compound was changed to 30 parts by weight of the monomer of Preparation Example 4, and exposed and developed as generally described in Example 1. Isolated dots of 170 microns remained. It had a Shore D hardness of 83° and no cracks occur when folded until 90°. The results are shown in Table 2.

EXAMPLE 4

A printing plate was prepared as generally described in Example 1, with the exception that the polymerizable compound was changed to 30 parts by weight of the monomer of Preparation Example 5, and exposed and developed as generally described in Example 1. Isolated dots of 170 microns remained. It had a Shore D hardness of 85° and no cracks occur when folded until 90°. The results are shown in Table 2.

EXAMPLE 5

A printing plate was prepared as generally described in Example 1, with the exception that the polyvinyl alcohol was changed to 40 parts by weight of one of Preparation Example 2 and the polymerizable compound was changed to 30 parts by weight of the monomer of Preparation Example 3, and exposed and developed as generally described in Example 1. Isolated dots of 200 microns remained. It had a Shore D hardness of 85° and no cracks occur when folded until 90°. After 6 months, no cracks occur when folded. The results are shown in Table 2.

COMPARATIVE EXAMPLE 1

A printing plate was prepared as generally described in Example 1, with the exception that the polymerizable compound was changed to a mixture of 15 parts by weight of ethyleneglycol dimethacrylate and 15 parts by weight of N-vinyl-2-pyrrolidone, and exposed and developed as generally described in Example 1. Isolated dots of 500 microns remained but the dots were side-etched. It had a Shore D hardness of 85° and many cracks occur when folded until 90°.

COMPARATIVE EXAMPLE 2

A printing plate was prepared as generally described in Example 1, with the exception that a polyvinyl alcohol available from Nippon Synthetic Chemical Co., Ltd. as Poval NK-03 (saponification degree=75 mol %, polymerization degree=300, without the ionic monomer and melt flow starting temperature=153° C.) was employed instead of the polyvinyl alcohol of Preparation Example 1. A printing plate was prepared as generally described in Example 1, and exposed and developed. The results are shown in Table 2.

COMPARATIVE EXAMPLE 3

Preparation and tests were conducted as generally described in Example 1, with the exception that the polyvinyl alcohol of Comparative Preparation Example 1 was employed instead of the polyvinyl alcohol of Preparation Example 1. The results are shown in Table 2.

TABLE 2

| | Polyvinyl alcohol (parts by weight) | Polymerizable monomer (parts by weight) | Exposing time (sec) | Developability Developing time (sec) | Isorated dots diameter (μm) | Relief Shore D | properties 90° fold test |
|---|---|---|---|---|---|---|---|
| Ex. | | | | | | | |
| 1 | Pre. Ex. 1 (40) | Pre. Ex. 3 (30) | 210 | 120 | 200 | 85° | No cracks |
| 2 | Pre. Ex. 1 (40) | Pre. Ex. 3 (30) Monomer[1] (10) | 210 | 120 | 250 | 85° | No cracks |
| 3 | Pre. Ex. 1 (40) | Pre. Ex. 4 (30) | 210 | 120 | 170 | 83° | No cracks |
| 4 | Pre. Ex. 1 (40) | Pre. Ex. 5 (30) | 210 | 135 | 170 | 85° | No cracks |
| 5 | Pre. Ex. 2 (40) | Pre. Ex. 3 (30) | 210 | 120 | 200 | 83° | No cracks |
| Comp. Ex. | | | | | | | |
| 1 | Pre. Ex. 1 (40) | Monomer[1] (15) Monomer[2] (15) | 210 | 150 | 500 | 83° | Cracks |

TABLE 2-continued

|   | Polyvinyl alcohol (parts by weight) | Polymerizable monomer (parts by weight) | Exposing time (sec) | Developability Developing time (sec) | Isorated dots diameter (μm) | Relief Shore D | properties 90° fold test |
|---|---|---|---|---|---|---|---|
| 2 | HNK-03 (40) | Pre. Ex. 3 (30) | 210 | 270 | 200 | 85° | No cracks |
| 3 | Comp Prep Ex. 1 (40) | Pre. Ex. 3 (30) | 210 | 210 | 200 | 85° | No cracks |

[1] Ethyleneglycol dimethacrylate
[2] N-vinyl-2-pyrrolidone

PREPARATION EXAMPLE 8

Preparation of the Polymerizable Compound (B)

A reaction vessel equipped with a condenser, a stirrer, a thermometer, a nitrogen gas introducing tube and a dropping funnel was charged with 50.6 parts of N-methylolacrylamide and 148 parts of butanol and adjusted to pH 3.0 by adding p-toluenesulfonic acid. The reaction was started with refluxing and terminated for about four hours. The reaction product was neutralized with dimethylaminopropylmethacrylamide and butanol was removed under a reduced pressure to obtain 75 parts of n-butoxymethylacrylamide.

PREPARATION EXAMPLE 9

A same reaction vessel as Preparation Example 8 was charged with 202 parts of n-methylolacrylamide, 134 parts of dipropylene glycol and 134 parts of toluene and adjusted to pH 3 by adding p-toluenesulfonic acid. It was reacted at 95° C. for 10 hours and then neutralized with dimethylaminopropyl methacrylamide. Toluene was removed under a reduced pressure to obtain 312 parts of a reaction mixture.

A photosensitive resin composition was prepared by mixing 50 parts of the above-obtained reaction mixture, 10 parts of trimethylolpropane triacrylate and 3 parts of benzoin methyl ether and applied on a cold rolled steel panel to form a 20 microns photosensitive resin layer. It was exposed to ultraviolet to cure. The cured layer had a pencil hardness of 2H or more and had no rusts on the steel plate after 5 days humidity test at 40° C.

PREPARATION EXAMPLE 10

A reaction vessel was charged with 230 g (2 mol) of N-methoxymethylacrylamide, 62 g (1 mol) of ethylene glycol, 120 g of toluene and 0.27 g of 2 acrylamide-2-methylpropanesulfonic acid and adjusted to pH 3.2. To the content, 0.1 g of p-methoxyphenol was added and reacted at 90° C. with stirring for 10 hours. After termination of the reaction, dimethylaminomethylmethacrylamide was added, adjusted to pH 7.1 and allowed to stand over night, followed by filtering to obtain 196 g of a liquid reaction product.

The resulting product was subjected to a high speed liquid chromatography (Shim-pack CLC-ODS available from Shimadzu Co., Ltd.) and the mixture contained diethers, monoethers, methoxymethylacrylamide, methylenebisacrylamide, acrylamide and others in a weight ratio of 60/20/13/3/2/2.

A cylindrical can having a diameter of 6.5 cm was charged with 10 g of the product and 0.3 g of 2-hydroxy-2-methyl-1-phenylpropane-1-on and exposed to a 3 kW high pressure mercury lamp at a distance of 70 cm for 3 seconds. The mixture was cured throughout and a tough and hard cured article was obtained.

PREPARATION EXAMPLE 11

A reaction vessel was charged with 258 parts of N-ethoxymethylacylamide, 200 parts of toluene, 134 parts of dipropylene glycol and 0.01 part of p-methoxyphenol, and adjusted to pH 3.2 by adding about 0.7 parts of phosphoric acid. It was then heated to 110° C. and reacted for 10 hours. After completion of the reaction, dimethylaminopropylmethacrylamide was added to adjust pH 7.2 to obtain 315 parts of a liquid reaction product.

A cylindrical can having a diameter of 6.5 cm was charged with 10 g of the product and 0.3 g of 2-hydroxy-2-methyl-1-phenylpropane-1-on and exposed to a 3 kW high pressure mercury lamp at a distance of 70 cm for 3 seconds. The mixture was cured throughout and a tough and hard cured article was obtained.

A printing plate was prepared as generally described in Example 1, with the exception that the polymerizable compound was changed to 30 parts by weight of the monomer prepared above, and exposed and developed as generally described in Example 1. Isolated dots of 200 microns remained. It had a Shore D hardness of 83° and no cracks occur when folded until 90°. After 6 months, no cracks occur when folded and no rusts are observed on the substrate.

PREPARATION EXAMPLE 12

A same reaction vessel as Preparation Example 8 was charged with 248 parts of N-methoxymethylacrylamide and 134 parts of toluene and adjusted to pH 2.1 by adding 2-acrylamide-2-methylpropane. It was reacted at 95° C. for 10 hours and then neutralized with dimethylaminopropyl methacrylamide. Toluene was removed under a reduced pressure to obtain 184 parts of a reaction mixture.

PREPARATION EXAMPLE 13

A same reaction vessel as Preparation Example 8 was charged with 101 parts of N-methylolacrylamide, 15 parts of urea and 20 parts of water, to which 0.5 parts of 2-acrylamide-2-methylpropanesulfonic acid was added and reacted at 80° C. for 2 hours. It was then neutralized with dimethylaminopropyl methacrylamide to obtain 312 parts of a reaction mixture.

PREPARATION EXAMPLE 14

A same reaction vessel as Preparation Example 8 was charged with 101 parts of N-methylolacrylamide and 110 parts of hydroquinone and adjusted to pH 3.3 by adding 2-amidephosphoxyethyl acrylate. It was reacted at 70° C. for 20 hours and then neutralized with laurylamine to obtain a reaction mixture.

PREPARATION EXAMPLE 15

A synthesis was conducted as generally described in Preparation Example 1, with the exception that 129 parts by weight of N-ethoxymethylacrylamide and 101 parts by weight of N-methylolacrylamide were employed.

What is claimed is:

1. A water-developable photosensitive resin composition capable of hot melt molding, comprising
   (A) a water soluble or water dispersible polyvinyl alcohol prepared by saponifying a copolymer obtained by copolymerizing 90 to 99.9 mol % of a vinyl ester and 0.1 to 10 mol % of an ionic group-containing monomer; said polyvinyl alcohol having a saponification degree of the vinyl ester unit of 60 to 75 mol % and a hot melt flow starting temperature of 95° to 170° C.,
   (B) a polymerizable compound prepared by reacting in the presence of an acid catalyst,
      (i) N-methylol (meth)acrylamide or N-alkoxymethyl (meth)acrylamide and
      (ii) a compound selected from the group consisting of monoalcohols, polyhydric alcohols, amides, haloalkylamides, aromatic compounds, ureas and mixtures thereof, and
   (C) a photopolymerization initiator.

2. The water-developable photosensitive resin composition according to claim 1 wherein said vinyl ester is selected from the group consisting of vinyl formate, vinyl acetate, vinyl propionate and vinyl benzoate.

3. The water-developable photosensitive resin composition according to claim 1 wherein said ionic group-containing monomer is selected from the group consisting of acrylic acid, itaconic acid, maleic acid, maleic anhydride, fumaric acid, 2-acrylamide propanesulfonic acid, (meth)allylsulfonic acid, a salt thereof if existent and (meth)acrylamidepropyltrimethylammonium chloride.

4. The water-developable photosensitive resin composition according to claim 1 wherein said polyvinyl alcohol has an average polymerization degree of not more than 1,000.

5. The water-developable photosensitive resin composition according to claim 1 wherein said polymerizable compound (B) is represented by the following formula;

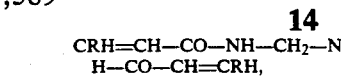

wherein R respectively represents a hydrogen atom or a methyl group, or

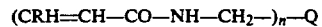

wherein R is the same as mentioned above, Q represents an oxygen atom, a monoalcohol moiety, a polyhydric alcohol moiety, an amide moiety, an aromatic compound moiety and a urea moiety and n shows an integer of 1 to 50.

6. The water-developable photosensitive resin composition according to claim 5 wherein said polymerizable compound (B) is prepared by reacting N-alkoxymethyl acrylamide and a polyhydric alcohol in the presence of an acid catalyst.

7. The water-developable photosensitive resin composition according to claim 1 wherein said polymerization initiator (C) is aromatic ketones.

8. The water-developable photosensitive resin composition according to claim 1 further comprising other polymerizable monomers (D) in addition to the polymerizable compound (B).

9. The water-developable photosensitive resin composition according to claim 1 comprising 5 to 250 parts by weight of the polymerizable compound (B), 0.01 to 30 parts by weight of the polymerization initiator (C), based on 100 parts by weight of the polyvinyl alcohol.

10. The water-developable photosensitive resin composition according to claim 1 further comprising 0.5 to 100 parts by weight of polymerizable monomer (D).

11. The water-developable photosensitive resin composition according to claim 1 further comprising additives.

12. A photosensitive resin plate comprising a substrate and the photosensitive resin composition according to claim 1 on said substrate.

13. The photosensitive resin plate prepared by molding the photosensitive resin composition according to claim 1 onto said substrate.

* * * * *